United States Patent
Al-khalidy et al.

(10) Patent No.: US 7,633,290 B1
(45) Date of Patent: Dec. 15, 2009

(54) APPARATUS AND METHOD FOR A FULLY AUTOMATED PREPARATION OF A HYPERPOLARIZING IMAGING AGENT

(75) Inventors: Abdul Rahman Abdallah Al-khalidy, Niskayuna, NY (US); Bruce Campbell Amm, Clifton Park, NY (US); John Arthur Urbahn, Saratoga Springs, NY (US); Jan Henrik Ardenkjaer-Larsen, Frederiksberg C (DK); Vincent Paul Staudinger, Niskayuna, NY (US); Jaydeep Roy, Saratoga Springs, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 12/206,823

(22) Filed: Sep. 9, 2008

(51) Int. Cl.
G01V 3/00 (2006.01)
(52) U.S. Cl. ........................ 324/307; 324/309
(58) Field of Classification Search ......... 324/300–322; 600/407–435; 435/325, 320; 530/350; 514/12; 604/181, 26
See application file for complete search history.

(56) References Cited

U.S. PATENT DOCUMENTS

| | | | |
|---|---|---|---|
| 4,091,323 A * | 5/1978 | Landis | 324/318 |
| 6,286,319 B1 * | 9/2001 | Hasson et al. | 62/49.1 |
| 6,356,080 B1 | 3/2002 | Daniels | |
| 6,515,260 B1 | 2/2003 | Anderson | |
| 6,523,356 B2 * | 2/2003 | Hasson et al. | 62/49.1 |
| 6,543,236 B2 * | 4/2003 | Zollinger et al. | 62/3.1 |
| 6,667,008 B2 * | 12/2003 | Zollinger et al. | 422/83 |
| 6,958,221 B2 | 10/2005 | Veerapandian et al. | |
| 7,287,391 B2 * | 10/2007 | Bolam | 62/55.5 |
| 7,312,043 B2 | 12/2007 | Maher et al. | |
| 2003/0109058 A1 * | 6/2003 | Bolam | 436/173 |
| 2004/0066193 A1 * | 4/2004 | Ardenkjaer-Larsen et al. | 324/309 |
| 2007/0038076 A1 | 2/2007 | Osada et al. | |
| 2007/0293901 A1 | 12/2007 | Rousso et al. | |
| 2008/0242974 A1 * | 10/2008 | Urbahn et al. | 600/420 |

FOREIGN PATENT DOCUMENTS

| | | |
|---|---|---|
| WO | WO9935508 | 7/1999 |
| WO | WO0236005 | 5/2002 |
| WO | WO2006106285 | 10/2006 |

* cited by examiner

Primary Examiner—Brij B Shrivastav
(74) Attorney, Agent, or Firm—Eileen W. Gallagher (57) ABSTRACT

Provided is an apparatus and method for automated hyperpolarization of samples for use as an imaging agent comprising a sample box, an airlock chamber configured to receive a sample from the sample box, a cryogenic chamber, a guide channel to transport samples from the airlock chamber to the cryogenic chamber, a heater and pressure module coupled to the sample box, an insertion and retraction device to transport samples through the guide channel to and from the cryogenic chamber, a dissolution module coupled to the sample box, and a controller to regulate hyperpolarization of the samples by controlling one or more of position, sequencing, temperature, pressure, and dissolution of the samples within the apparatus. Also provided is a machine-readable medium comprising instruction which, when executed by a controller, causes a hyperpolarization apparatus to perform the steps of hyperpolarization of a sample.

25 Claims, 6 Drawing Sheets

APPARATUS AND METHOD FOR A FULLY AUTOMATED PREPARATION OF A HYPERPOLARIZING IMAGING AGENT

BACKGROUND

Embodiments of the invention are directed to an apparatus and method for fully automated, noninvasive system to prepare hyperpolarizing imaging agents for use in magnetic resonance imaging (MRI). More specifically, embodiments of the invention relates to an apparatus and method for noninvasively polarizing, filtering, and performing quality control testing of the hyperpolarizing imaging agents prior to introduction to a subject being imaged.

MRI is a diagnostic technique that has become particularly attractive to physicians as it is non-invasive and does not involve exposing the patient under study to potentially any harmful exposure such as from X-rays. Analytical high resolution NMR spectroscopy is routinely used in the determination of molecular structure.

MRI and NMR spectroscopy lack some degree of sensitivity due to the normally very low polarization of the nuclear spins of the contrast agents typically used. A number of techniques exist to improve the polarization of nuclear spins. These techniques are known as hyperpolarization techniques and lead to an increase in sensitivity. In hyperpolarization techniques, a sample of an imaging agent, for example $^{13}$C-Pyruvate or another agent, is introduced or injected into the subject being imaged.

In many instances, the imaging agent undergoes this hyperpolarization in an apparatus in close proximity to its end use. This is due to the normally short lifetime (longitudinal relaxation time T1) of the polarization causing the spins to relax back to the thermal equilibrium polarization. One technique to address the normally short lifetime is to use Dynamic Nuclear Polarization to polarize the spins in the solid state. Apparatuses used to produce the hyperpolarized samples are provided with a low temperature space that is in a magnetic field. As typically constructed, the apparatus is equipped with a flow cryostat that includes a vacuum insulated chamber inserted into the bore of a magnet. The cryostat is cooled by way of a stream of a cold cryogen provided by an external cryogen supply through a transfer line and pumping device, and the flow of cryogen into the flow cryostat cools the bore of the magnet and forms the low temperature space.

The imaging agent is transferred to the cryostat where hyperpolarization occurs through interaction with an Electron Paramagnetic Agent (EPA) within a magnetic field. The now cryogenically frozen material is subsequently dissolved in a dissolution material delivered by way of a fluid path delivery system. A second fluid path system is used to displace the dissolved material from the polarizer.

Once removed from the polarizer, the now dissolved hyperpolarized imaging agent is filtered to remove the EPA and other additives. A receiver vessel is used to collect the pharmacological product and allow for quality control (QC) testing of the material prior to being released for a patient.

The hyperpolarized imaging agent produced in this manner is sensitive to handling and environmental conditions, exacerbated by its short lifetime. These can affect the safety and efficacy of the imaging agent. Other difficulties in production are associated with the need to QC test multiple variables within a short time period while sterility and efficacy is maintained.

Furthermore, current hyperpolarization systems are inefficient and expensive to operate. For example hyperpolarization requires high cryogen consumption and is energy and labor intensive, often requiring the operator to handle liquid cryogens and guide and insert samples into the polarizer. It is thus desirable that an improved hyperpolarization system be designed to operate in a manner that minimizes disruption to the surrounding environment, allow more continuous operation, without the requirement of the operator to handle liquid cryogens, and to increase throughput of the hyperpolarized imaging agent samples.

Therefore what is needed is a fully automated, noninvasive apparatus and method adapted to the preparation of one or more hyperpolarized imaging agent for delivery to its end-use while preserving the sterility, safety and efficacy of the imaging agent.

BRIEF DESCRIPTION

The present invention overcomes the aforementioned drawbacks by providing a fully automated apparatus and method for producing hyperpolarized samples for use in magnetic resonance systems.

In a first aspect, the invention provides an apparatus for automated hyperpolarization of samples for use as an imaging agent comprising a sample box, an airlock chamber configured to receive a sample from the sample box, a cryogenic chamber, a guide channel to transport samples from the airlock chamber to the cryogenic chamber, a heater and pressure module coupled to the sample box, an insertion and retraction device to transport samples through the guide channel to and from the cryogenic chamber, a dissolution module coupled to the sample box, and a controller to regulate hyperpolarization of the samples by controlling one or more of position, sequencing, temperature, pressure, and dissolution of the samples within the apparatus.

In a second aspect, the invention provides a method for an automated method for hyperpolarization of a sample for use as an imaging agent comprising, loading the sample contained in a sample delivery device into a sample box, transporting the sample contained in the sample deliver device to an airlock chamber, evacuating the airlock chamber, inserting the sample delivery device from the airlock chamber through a guide channel into a cryogenic chamber while automatically controlling the insertion force of the sample delivery device through the guide channel, polarizing the sample, heating and pressurizing a dissolution solution, adding the dissolution solution to the sample, and retracting the dissolution solution and the sample from the cryogenic chamber to a receiving vessel.

Also in a third aspect, the invention provides a machine-readable medium comprising instruction which, when executed by a controller, causes a hyperpolarization apparatus to perform the steps of hyperpolarization of a sample.

BRIEF DESCRIPTION OF THE DRAWINGS

The drawings illustrate an embodiment presently contemplated for carrying out the invention.

DETAILED DESCRIPTION

Definitions

The following detailed description is exemplary and not intended to limit the invention of the application and uses of the invention. Furthermore, there is no intention to be limited by any theory presented in the preceding background of the invention or the following detailed description of the drawings.

As used herein, "adapted to," "coupled," and the like refer to mechanical, structural, electrical, or optical connections between elements to allow the elements to cooperate to provide a described effect.

As used herein the term "polarize" refers to the modification of the physical properties of a material for further use in MRI. Further, as used herein, the term "hyperpolarized" refers to polarization at a level over that found at room temperature and at 1 Tesla, which is further described in U.S. Pat. No. 6,466,814.

As used herein the term "dynamic filtration" refers to the ability of a filtration device to remove or filter one or more components of a mixture having a time varying solubility in a medium of the mixture carrying the pharmaceutical product. As will be described in detail below, the solubility of the components may vary with changing pressure, temperature, volume, pH of the medium, for example.

As used herein the term "electron paramagnetic agent" (EPA) refers to agents, which allows for dynamic nuclear polarization by transferring spin from highly polarized electrons to nuclear spins. A commonly used EPA is tris (8-carboxyl-2,2,6,6-tetra(2-(1-methoxy-2,2-d2-ethyl))-benzo [1,2-d:4,5-d']bis(dithiole-4-yl)methyl sodium salt.

As used herein the term liquid-state polarization (LSP) refers to the polarization state resulting from the dissolution of a solid-state polarized material. Often a transfer function is used to determine dissolution efficiency (DE) whereby:

DE=Liquid-state polarization %/Solid-state polarization %.

Provided herein are methods and apparatus for the aqueous dissolution and dynamic filtration of hyperpolarized imaging agents. Representative methods and apparatuses for dissolution and dynamic filtration are described in co-owned U.S. patent application Ser. No. 11/692,642 and U.S. patent application Ser. No. 11/766,881, which are hereby incorporated by reference.

Disclosed herein is an automation and control system used to automate, with minimal user intervention, the steps involved in loading (for hyperpolarization), compounding and unloading a sample of an imaging agent from ambient conditions, through a polarizer system and into a receiver.

Figure 1:
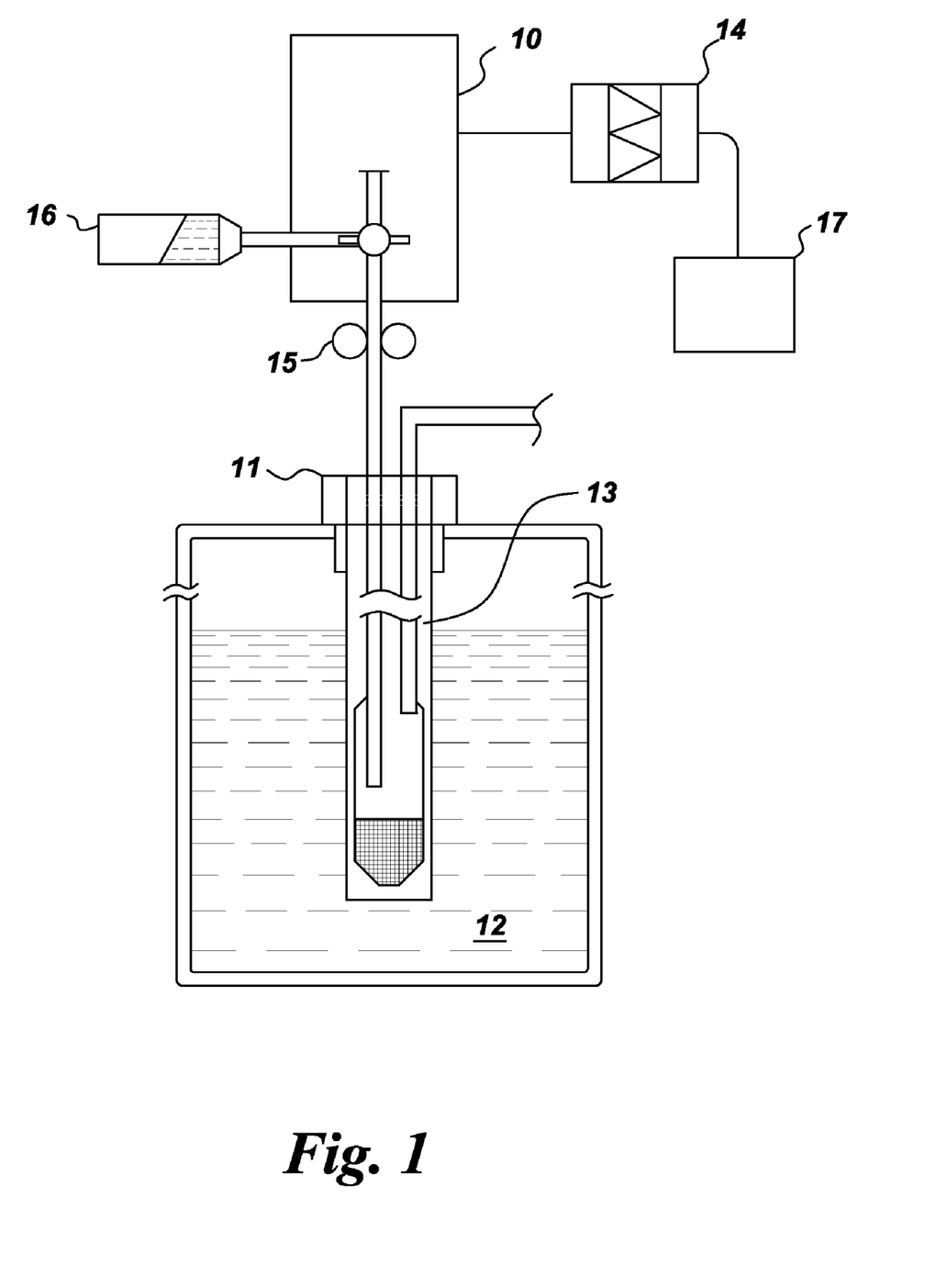
FIG. 1 is a block diagram and schematic of an apparatus to hyperpolarize materials according to an embodiment of the current invention.

Referring to FIG. 1, an automated system is shown which includes a sample box 10, an airlock chamber 11, a cryogenic chamber 12, a guide channel 13 to transport samples from the airlock chamber 11 to the cryogenic chamber 12, a heater and pressure module 14 coupled to the sample box 10, an insertion and retraction device 15 to transport samples through the guide channel 13 to and from the cryogenic chamber 12, a dissolution module 16 coupled to the sample box 10, and a controller 17 to regulate the hyperpolarization of samples.

Sample Box

A sample box 10 is provided for loading an imaging agent into the apparatus to be polarized. In one embodiment, the sample box 10 may be designed to receive a sample delivery device, configured to hold an imaging agent and a dissolution medium, and enables the sample delivery device 10 to be positioned for insertion into the airlock chamber 11. In another embodiment, the sample box 10 may be configured to receive a plurality of sample delivery devices.

The size and shape of the sample box 10 may vary to accommodate the sample delivery device. In one embodiment a rectangular design may be used. In another embodiment, the sample box 10 may be cylindrical.

In one embodiment, the sample box 10 may be held in a stationary position. In another embodiment, the sample box 10 may be a movable component and coupled to the sample delivery device.

Airlock Chamber

An airlock chamber 11 may be provided for insertion of a sample delivery device from ambient pressure and temperature into a cryogenic chamber 12 while maintaining low temperature and pressure conditions within the cryogenic chamber 12. In one embodiment, the airlock chamber 11 may be designed to contain a sample delivery device, which may be configured to hold an imaging agent. The airlock chamber 11 comprises a dynamic seal on the sample loading end and a gate valve on the guide channel end. In one embodiment, the dynamic seal allows for purging of the airlock chamber 11 and vacuum operations through a properly sized orifice. In one embodiment purging may be accomplished using an inert gas such as helium. The timing and duration of the purge operation may be monitored and regulated by the controller 17. Pressure sensors monitor pressure of the purge gas and vacuum pressure inside the airlock. Monitoring provides a method for establishing that a proper vacuum is attained and maintained before the gate valve is opened and the sample inserted into the guide channel 13.

Figure 2:
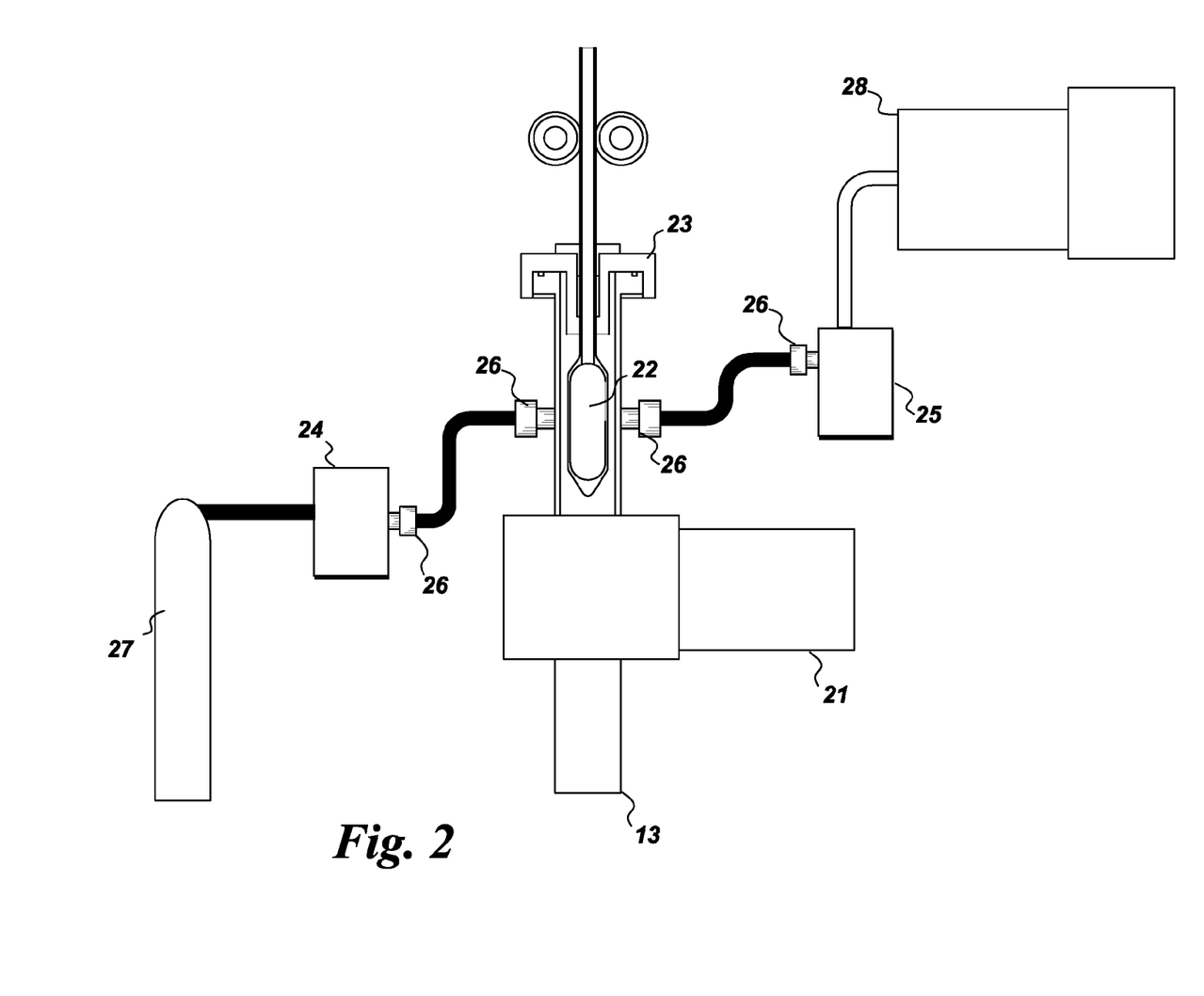
FIG. 2 is a representative sample-delivering device.

In one embodiment, shown in FIG. 2, an ultra high vacuum (e.g., $\sim 10^{-7}$ torr) in the cryogenic chamber 12 may be maintained while the sample delivery device is inserted from ambient conditions. The sample delivery device comprises a sample vial, for containing the sample and a dissolution fluid path system, which comprises a network of narrow diameter tubes. As shown in FIG. 2, in one embodiment a dual-acting pneumatic gate valve 21 controls the interface between the airlock chamber 11 and the guide channel 13. During sample loading, the gate valve 21 is typically in a closed configuration, providing sealing between the airlock chamber 11 and the guide channel 13. In one embodiment, the sample vial 22 is inserted into the airlock chamber 11 and a dynamic seal 23, having a threaded sliding design, is threaded into the tapped upper opening of the airlock chamber 11.

Referring further to the embodiment shown in FIG. 2, the airlock chamber 11 has two other valves, a helium valve 24 and a vacuum valve 25. These valves are used to interface with a low-pressure helium tank 27 and a mechanical vacuum pump 28. In one embodiment the parts are coupled to valves 24 and 25 by a swage lock connector 26. Once the dynamic seal 23 and sample vial 22 are in place, the controller 17 toggles open the helium valve 24 for a short period of time filling the airlock chamber 11 with helium. The control system then toggles opens the vacuum valve 25 exposing the airlock chamber 11 to a continuously active mechanical vacuum pump 28.

The pump evacuates the helium from the airlock chamber 11 creating a vacuum. This vacuum may be monitored using a pressure sensor (the 'vacuum sensor'). In one embodiment, the airlock chamber 11 may be exposed to several purge cycles, filling and evacuating the airlock chamber 11 with helium, until the vacuum sensor records a pressure of less than $10^{-3}$ torr or a similar pressure threshold. The vacuum valve 25 is opened again and the pressure in the chamber monitored. If the pressure stays below the threshold the controller 17 opens the gate valve 21. The sample vial 22 may be then automatically driven into the guide channel 13 using an insertion and retraction device 15 that causes the sample vial tube to slide along the dynamic seal 23 without allowing ambient air to enter the chamber, thus maintaining the vacuum in the guide channel 13 while the sample is inserted.

Guide Channel

The guide channel 13 may be coupled to the airlock chamber 11 and allows one or more sample vials to be guided into and out of the cryogenic chamber 12. In one embodiment the overall dimensions of the guide channel 13 determines staging positions of the sample vial through the guide channel 13, which allow the sample vial to obtain equilibrium at various locations along the guide channel 13. In one embodiment the guide channel 13 may be configured to allow more than one sample vial to be inserted into or extracted from the cryogenic chamber 12 sequentially or in parallel.

Insertion and Retraction Device

The insertion and retraction device 15 may be a tube feeding system with accurate position and velocity feedback to a controller 17. In one embodiment the insertion and retraction device 15 comprises a mechanical friction wheel drive mechanism with precisely machined grooves, an adjustable clamp mechanism for applying the required normal force between two friction wheels and the dissolution fluid path of the sample delivery device, a balancing mechanism that balances the gravitation weight of the sample delivery device and provides a slightly upward buoyant force, at least two transducers that measure the real-time position of the friction wheels and the fluid path, and a controller 17 that uses the information received from the two transducers to produce a 'slip-free' motion to the desired locations. In alternative embodiments, redundant position measurements may be obtained using separate passive friction wheel sets with rotary transducers, optical fiducial sensors, or specific control algorithms that allow the sample to move along a desired trajectory without slippage.

Figure 3:
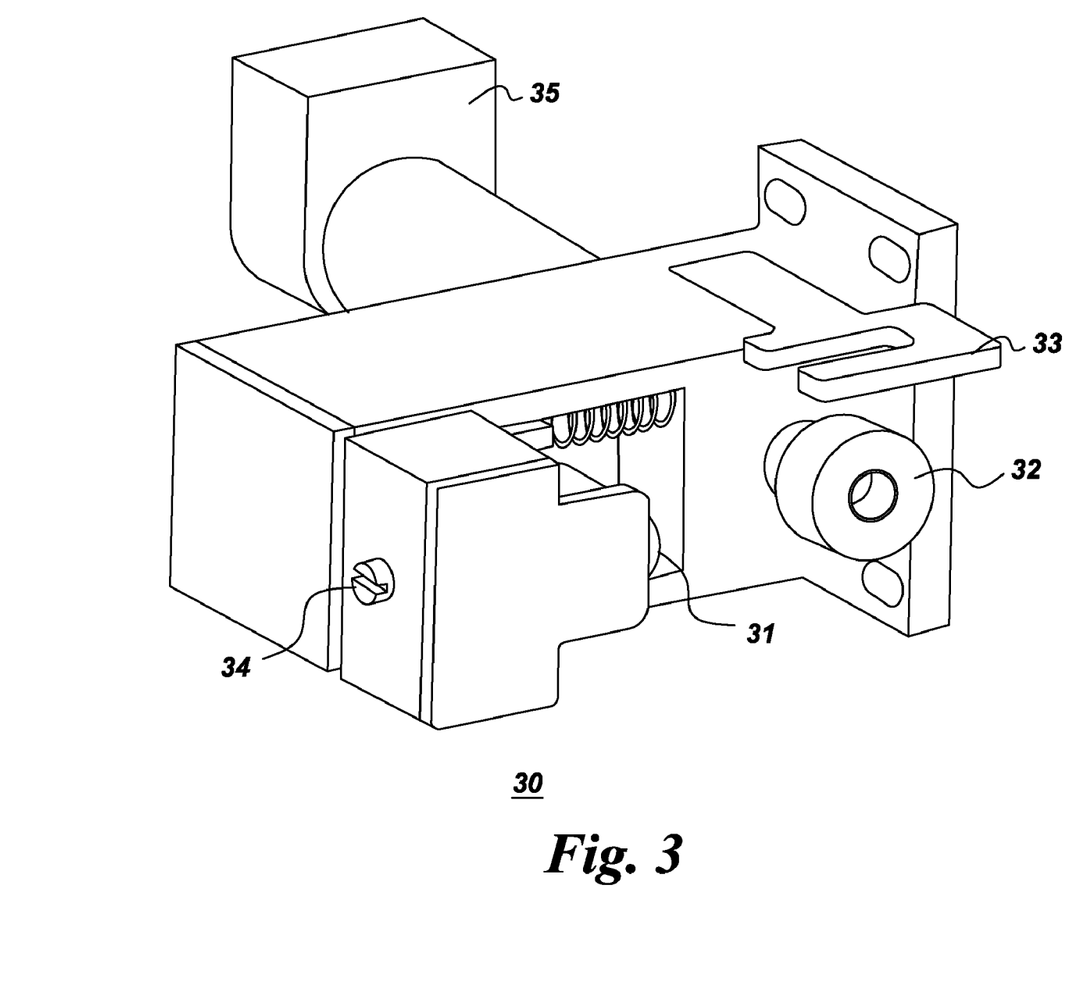
FIG. 3 is a representative friction wheel mechanism.

In one embodiment, as shown in FIG. 3, an insertion and retraction device 15 comprises a friction wheel mechanism and clamp 30. In one embodiment, the dissolution fluid path of the sample delivery device may be placed into the friction wheel mechanism; the sample vial loaded into the airlock chamber 11, and the dynamic seal positioned. The dissolution fluid path rests in the groove of the drive wheel 31 of the friction wheel mechanism shown in FIG. 3. The groove may be machined to have a semi circular shape with a slightly smaller diameter than the outer diameter of the dissolution fluid path. The idler wheel 32, having a similar 'mirror-image' groove may be snapped into place using for example, a one-snap clamp mechanism. In one embodiment, a tube guide 33 may also be used to position the sample delivery device. The normal force applied by the wheels on the dissolution fluid path can be adjusted using an adjustable tension mechanism 34, such as an adjustable screw on the clamp. This adjustment may be done to provide sufficient drive force between the wheels and the dissolution fluid path without deforming the dissolution fluid path.

In one embodiments actuation and drive mechanisms for insertion and retraction of the dissolution fluid path into and from the guide channel 13 may be actuated using electric or DC motors such as stepper motors, linear motors, and servomotors. In one embodiment a servomotor 35 may be used to drive the 'driver' wheel of the mechanism. The drive force, or the force required from the servomotor (and hence the size of the servomotor) may be kept relatively small by the counterweight based balancing mechanism, which minimizes the gravitational load of the dissolution fluid path that is driven by the mechanism. The servomotor has an integrated rotary transducer that measures the rotation of the servomotor, and indirectly the driver wheel, as the motor turns. In the absence of any slippage between the friction wheels and the dissolution fluid path, the transducer signal may also indicate the position of the sample vial and the dissolution fluid path. Due to limits on the force that can be applied between the friction wheels and the dissolution fluid path and due to the high frictional resistive force applied by the dynamic seal on the outer tube of the dissolution fluid path, there may be slippage between the tube and the wheels. This may cause measurements of the position of the sample vial and the dissolution fluid path to be inaccurate. In one embodiment a second displacement transducer may be used and may be attached between a fixed support plate of the sample box 10 or another stationary feature and the dissolution fluid path. The displacement transducer may be a linear transducer such as a draw wire displacement transducer. The displacement transducer measures the displacement of the dissolution fluid path, and indirectly the sample vial, with respect to the fixed reference frame attached to the fixed support plate.

Figure 4:
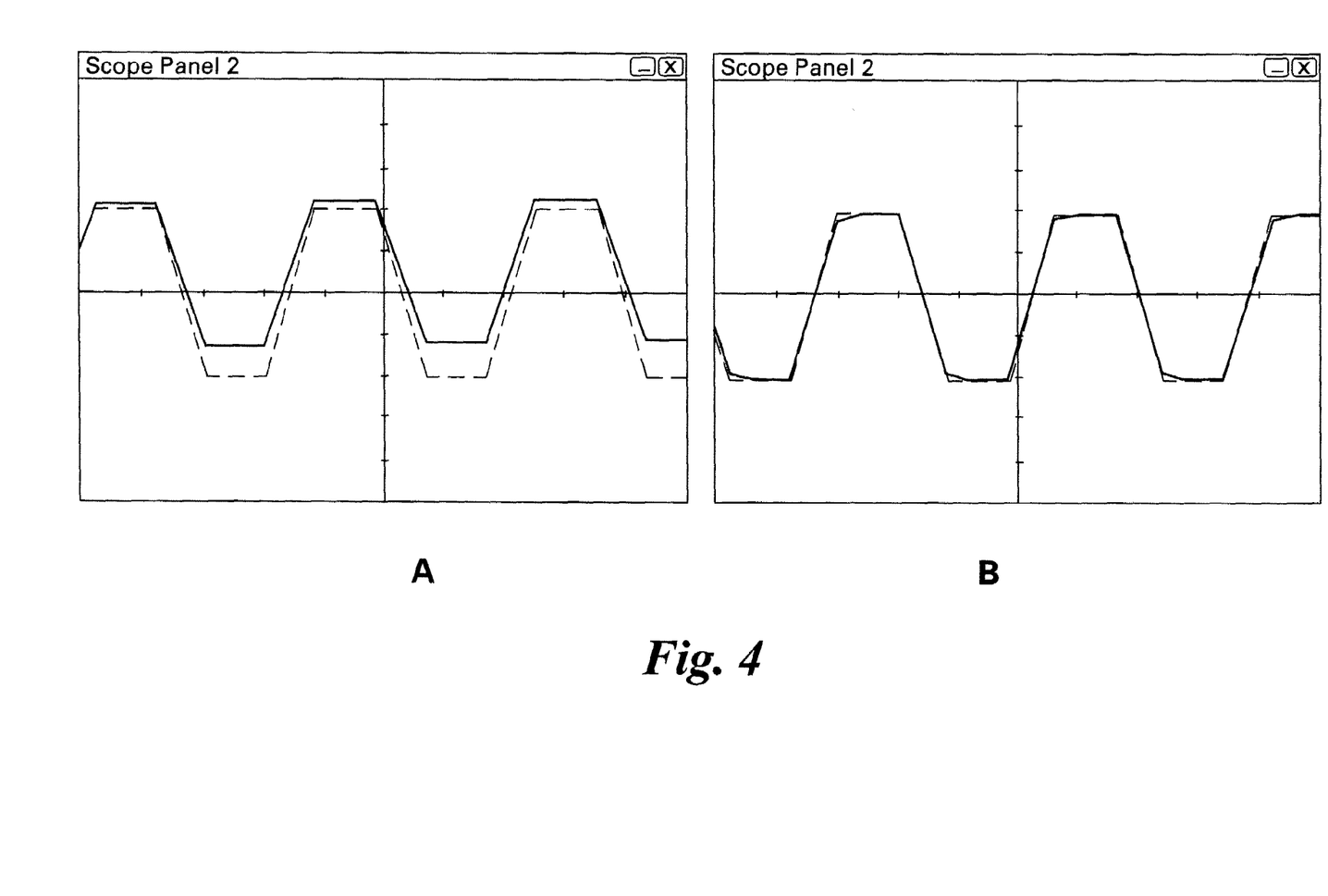
FIG. 4 shows the sample vial position measurements using the draw wire transducer attached to the fixed support plate with (A) no Gaussian filter applied and the position feedback is from the motor transducer and (B) using a Gaussian filter between the motor transducer and draw wire transducer.

The time-varying force applied by the servomotor controls the motion of the dissolution fluid path through the guide channel 13. In one embodiment, this force may be computed and applied in real-time at a 1 kHz rate by a servo-controller running a PID control algorithm that takes as its input the desired location and velocity of the sample vial at a given time. The algorithm uses position and velocity feedback to achieve closed loop control. The velocity feedback may be obtained by electronically deriving the high-resolution motor transducer position feedback. In one embodiment, the position feedback to the servo-controller may be implemented using a Gaussian IIR filter between the two transducers that is weighted towards the draw wire displacement transducer and converges to the reading of this transducer in steady state. The Gaussian filtered position feedback may be used to determine that the position of the sample vial and tracks the desired position at any given time, thus providing precise vial positioning. The control algorithm remains stable at any given time, thus preventing run-away states of the servomotor. FIG. 4 shows the sample vial toggling between two desired set point positions, where the position of the vial is measured using the draw wire transducer attached to the fixed support plate. In (A), no Gaussian filter is applied and the position feedback is from the motor transducer. In (B), the Gaussian filter between the motor transducer and draw wire transducer is used. In (A), the vial slips and does not reach its desired positions whereas in (B), the vial more precisely tracks the desired positions.

Heater and Pressure Module

The heater and pressure module 14 may be designed to control the temperature and pressure of the dissolution solution during operations and may be coupled to the sample box 10. In one embodiment, the sample box 10 contains a heater block positioned to regulate the temperature of the dissolution solution. The dimensions of the heater block are controlled by the volume and shape of the dissolution module, which is configured to contain the dissolution solution. In one embodiment, the heater and pressure module 14 comprises one or more temperature and pressure sensors that monitor the temperature and pressure of the sample box 10. The controller 17 controls the heater block temperature during operation.

Dissolution Module

The dissolution module 16 may be designed for rapid mixing of a dissolution solution with the imaging agent contained in the sample vial and to control the flow of a dissolution solution from a sample delivery device during operations. In one embodiment, the dissolution module may be integrated into the sample box 10. The sample delivery device comprises a sample vial, a dissolution fluid path, a delivery fluid path, and a receiving vessel.

In one embodiment, the dissolution fluid path comprises an outer tube, the outer tube having an output end in fluid communication with the vial and an input end attached to a pressure vessel for containing a dissolution solution. The delivery fluid path comprises an inner tube positioned within the outer tube of the dissolution fluid path and having a first end hermetically attached to the vial to transport there from the sample and dissolution solution. The receiving vessel is connected to a second end of the delivery fluid path to receive the sample and dissolution solution. A dissolution fluid path valve may be positioned between the pressure vessel and the dissolution fluid path to control flow of the dissolution solution, and a delivery fluid path valve may be positioned to control flow of the sample and dissolution solution from the delivery fluid path to the receiving vessel.

In one embodiment, the dissolution solution may be pressurized and held at a fixed pressure. The pressure may be set via a valve regulator and determined based on the apparatus, such as 250 psi of helium. In one embodiment, the dissolution module further comprises an actuating device to turn on and off the dissolution fluid path valve that separates a heated dissolution solution from a frozen imaging agent solution in the sample vial. The actuation mechanisms will depend on the choice of the control valves.

Figure 5:
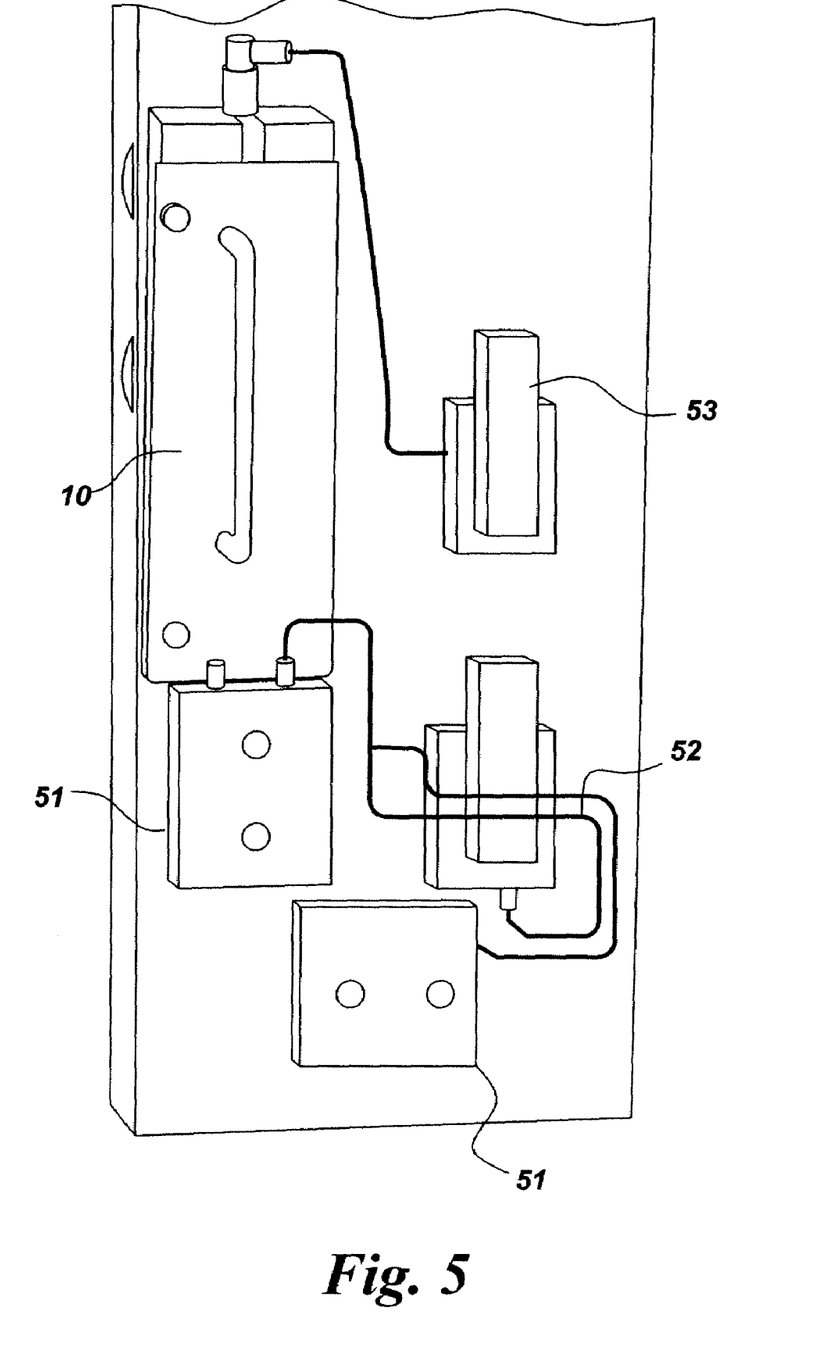
FIG. 5 is a representative sample box.

In one embodiment, the dissolution module and the heater and pressure module 14 may be integrated into the sample box 10 to allow for automated sample loading and unloading of the imaging agent. In one embodiment, the sample box 10 may be stationary and the sample delivery device is inserted through a fixed opening. In another embodiment the sample box 10 may have a two-part hinged design, a fixed part and a movable part, each part having a semi circular groove that matches the shape and diameter of a pressure vessel of the sample delivery device. As shown in FIG. 5, in one embodiment, the sample box 10 may comprise a stainless steel enclosure with a hinged door for containing a heater bock, actuators 51 for inlet and exit valves, solenoid valves 52 for the actuators, and a solenoid valve 53 for maintaining pressure in the dissolution module.

In one embodiment, the pressure vessel may be a syringe that can be in the form of a motor powered or pneumatic syringe that produces force to inject the dissolution solution into the sample vial. An operator is able to position the syringe into a groove on the fixed half of the sample box 10 and close the moving half. The syringe may also be held in place by a smaller diameter ledge at the bottom of the heater block. Further support to the dissolution fluid path may be provided by two semi-circular grooves that match the dimensions of the dissolution fluid path. A portion of the dissolution fluid path may be positioned into the circular groves. The sample box 10 may be held in a closed position by one or more fasteners, such as a thumbscrew. The dissolution module, integrated into the sample box 10, may further comprise one or more actuators for inlet and exit valves, solenoid valves for the actuators, and one or more solenoid valves for maintaining pressure in the dissolution fluid path wherein the actuators are engaged by closing the sample box 10.

Controller

A control system 17 is provided comprising electronic hardware, a machine-readable medium and a user interface to automate hyperpolarization of samples. In one embodiment a single integrated interface may be provided whereby a user is able to perform one or more steps involved in loading the sample contained in a sample delivery device into an airlock chamber 11 including: evacuating the airlock chamber 11, inserting the sample delivery device through a guide channel 13 from an ambient position to a cryogenic chamber 12 while automatically controlling the insertion force of the sample delivery device through the guide channel 13, polarizing the sample, heating and pressurizing a dissolution solution, adding the dissolution solution to the sample, and retracting the dissolution solution and the sample from the cryogenic chamber 12 to a receiving vessel.

Figure 6:
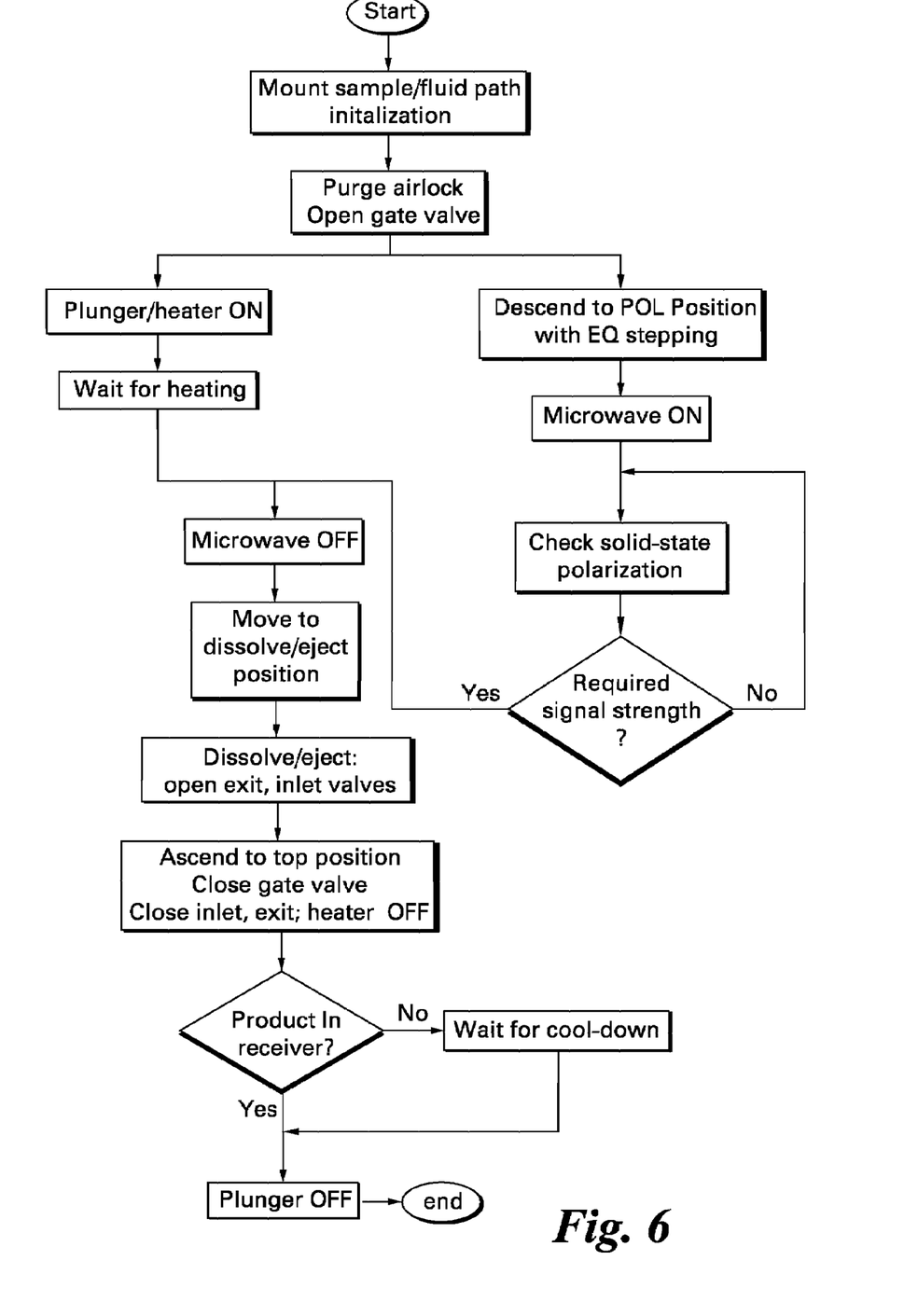
FIG. 6 is a block diagram of representative automated process steps.

In one embodiment automation channels are controlled with interlocks and process checks to aid a user in using the control system. In one embodiment, a machine-readable medium may be provided comprising instructions which, when executed by the controller 17, causes the hyperpolarization apparatus to perform the method of loading, preparing, dissolving and unloading a sample. Representative steps are illustrated in FIG. 6.

We claim:

1. An apparatus for automated hyperpolarization of samples for use as an imaging agent comprising:
    a sample box;
    an airlock chamber configured to receive a sample from the sample box;
    a cryogenic chamber;
    a guide channel to transport a sample from the airlock chamber to the cryogenic chamber;
    an insertion and retraction device to transport a sample through the guide channel to and from the cryogenic chamber;
    a heater and pressure module coupled to the sample box;
    a dissolution module coupled to the sample box; and
    a controller to regulate hyperpolarization of the samples by controlling one or more of position, sequencing, temperature, pressure, and dissolution of the samples within the apparatus.

2. The apparatus of claim 1 wherein the airlock chamber allows insertion of samples into the cryogenic chamber while maintaining a vacuum in the cryogenic chamber.

3. The apparatus of claim 2 wherein the airlock chamber comprises a dynamic seal on the sample box end and a gate valve on the guide channel end.

4. The apparatus of claim 3 wherein the airlock chamber is coupled to a first valve and a second valve wherein opening and closing of the first valve and second valve allows purging of the airlock chamber.

5. The apparatus of claim 2 wherein the airlock chamber further comprises one or more pressure sensors to monitor pressure within the airlock chamber.

6. The apparatus of claim 1 wherein the sample box is configured to receive at least one sample delivery device wherein the sample delivery device comprises:
    a vial for containing a sample therein;
    a dissolution fluid path comprising an inner tube and having an output end in fluid communication with the vial and an input end attached to a pressure vessel for containing a dissolution solution;

a delivery fluid path comprising an outer tube positioned about the inner tube of the dissolution fluid path and having a first end hermetically attached to the vial to transport therefrom the sample and dissolution solution;

a receiving vessel connected to a second end of the delivery fluid path to receive the sample and dissolution solution;

a dissolution fluid path valve positioned between the pressure vessel and the dissolution fluid path to control flow of the dissolution solution; and a delivery fluid path valve to control flow of the sample and dissolution solution from the delivery fluid path to the receiving vessel.

7. The apparatus of claim 6 wherein the sample box further comprises one or more positioning guides attached to the sample box wherein the one or more guides provides a snap-fit connection and mechanical support for loading the pressure vessel.

8. The apparatus of claim 7 wherein the sample box comprises a stainless steel enclosure comprising a heater block.

9. The apparatus of claim 8 wherein the heater block comprises two or more movable parts hinged together to provide access for enclosing the pressure vessel.

10. The apparatus of claim 7 wherein the pressure vessel is a syringe.

11. The apparatus of claim 1 wherein the heater and pressure module controls the temperature and pressure of a dissolution solution through the dissolution fluid path.

12. The apparatus of claim 11 wherein the heater and pressure module comprises one or more temperature sensors that monitor the temperature of the sample box.

13. The apparatus of claim 11 wherein the heater and pressure module comprises one or more pressure regulators that control the pressure of the dissolution solutions.

14. The apparatus of claim 1 wherein the insertion and retraction module controls position or velocity of the sample delivery device through the guide channel and into the cryogenic chamber.

15. The apparatus of claim 14 wherein the insertion and retraction mechanism comprises:

a drive mechanism;

an actuator coupled to the drive mechanism; and one or more transducers to measure the position of the sample delivery device.

16. The apparatus of claim 15 wherein the drive mechanism comprises:

at least two friction wheels wherein a first friction wheel is coupled to the drive mechanism and a second friction wheel is aligned with the first friction wheel; and an adjustable tension mechanism for applying force between the at least two friction wheels and the sample delivery device.

17. The apparatus of claim 16 wherein the one or more transducers comprises at least one of a displacement transducer for measuring the displacement of the dissolution fluid path with respect to a fixed reference point, a rotary transducer for measuring the rotary position of the first friction wheel, a rotary transducer for measuring the rotary position of the second friction wheel, an optical fiducial sensor, and any combinations thereof.

18. The apparatus of claim 17 further comprising:

a passively driven set of friction wheels;

an adjustable tension mechanism for applying force between the passively driven friction wheels and the sample delivery device; and a rotary transducer coupled to the passively driven set of friction wheels wherein the rotary transducer measures the rotary position of the passively driven set of friction wheels.

19. The apparatus of claim 1 wherein the dissolution module comprises:

an actuating device;

one or more control values that separate a dissolution solution within the sample box from the samples positioned within the cryogenic chamber; and wherein the actuating device regulates the opening and closing of the control valves.

20. An automated method for hyperpolarization of a sample for use as an imaging agent comprising:

loading the sample contained in a sample delivery device into a sample box;

transporting the sample contained in the sample delivery device to an airlock chamber;

evacuating the airlock chamber;

inserting the sample delivery device from the airlock chamber through a guide channel into a cryogenic chamber while automatically controlling the drive force of the sample delivery device through the guide channel;

polarizing the sample;

heating and pressurizing a dissolution solution;

adding the dissolution solution to the sample;

retracting the dissolution solution and the sample from the cryogenic chamber to a receiving vessel; and retracting the sample delivery device from the cryogenic chamber.

21. A machine-readable medium comprising instructions which when executed by a controller causes a hyperpolarization apparatus to perform the method of claim 20.

22. The machine-readable medium of claim 21 further comprising instructions to compute the amount of drive force used to drive the sample-delivering device.

23. The machine-readable medium of claim 22 wherein the instructions cause the controller to execute a filter equation to compute the amount of drive force using at least one measurement of position or velocity of the sample delivery device.

24. The machine-readable medium of claim 23 wherein the filter equation comprises a feedback component and a feedforward component.

25. The machine-readable medium of claim 23 further comprising instruction which when executed cause the controller to perform a slip-correction using measurements of position or velocity from two or more transducers.

* * * * *